United States Patent [19]
Ernolf et al.

[11] Patent Number: 5,944,539
[45] Date of Patent: Aug. 31, 1999

[54] ELECTRICAL CONNECTOR AND A PRINTED CIRCUIT BOARD

[75] Inventors: Stig Carl-Oskar Ernolf, Sollentuna; Bo Uno Egon Henningsson; Lars Henrik Lindqvist, both of Nynäshamn; Björn Bertil Hammar, Katrineholm, all of Sweden

[73] Assignee: Telefonaktiebolaget LM Ericsson, Stockholm, Sweden

[21] Appl. No.: 08/750,292

[22] PCT Filed: Jun. 2, 1995

[86] PCT No.: PCT/SE95/00640

§ 371 Date: Dec. 5, 1996

§ 102(e) Date: Dec. 5, 1996

[87] PCT Pub. No.: WO95/35017

PCT Pub. Date: Dec. 21, 1995

[30] Foreign Application Priority Data

Jun. 10, 1994 [SE] Sweden ................................. 9402017

[51] Int. Cl.⁶ ........................................................ H01R 4/66
[52] U.S. Cl. ............................................. 439/95; 439/609
[58] Field of Search ............................. 439/95, 97, 108, 439/607, 608, 609, 610

[56] References Cited

U.S. PATENT DOCUMENTS

| 4,420,793 | 12/1983 | Strandberg. |
| 4,439,809 | 3/1984 | Weight et al. .................. 439/108 |
| 4,889,959 | 12/1989 | Taylor et al. ..................... 439/95 |

FOREIGN PATENT DOCUMENTS

| 0370833 | 5/1990 | European Pat. Off. . |
| 0430105 | 6/1991 | European Pat. Off. . |
| 0467400 | 1/1992 | European Pat. Off. . |
| 0524426 | 1/1993 | European Pat. Off. . |
| 0561497 | 9/1993 | European Pat. Off. . |
| 2254490 | 10/1992 | United Kingdom . |

*Primary Examiner*—Gary Paumen
*Assistant Examiner*—Alexander Gilman
*Attorney, Agent, or Firm*—Burns, Doane, Swecker & Mathis, L.L.P.

[57] ABSTRACT

The invention relates to an electrical connector (15) comprising a cable connection part (15a) and a circuit-board connection part (15b), wherein the metallic casings (16, 17) of the connection parts are electromagnetically screening and earth potential connected and include means (such as 20) for providing the casings (16, 17) of respective connecting parts (15a, 15b) with a common earth potential (5') when the parts are in a mutually coacting state. The circuit board (4) includes edge-oriented, and resilient electrical contact means (30) connected to earth potential and coacting with the metallic casing of the circuit-board connecting part. A unit provided with electrical contact devices and positioned within the electrical contact means (30) is connected by its associated connecting device or devices with a circuit-board contact surface or surfaces through the medium of connecting wires or connecting pins. The metallic casing (16) of the circuit-board connecting part is comprised of four wall-parts (16a, 16b, 16c, 16d) which are normally, but not necessarily, angled at 90° and of which three wall-parts (16a, 16b, 16c) define an opening (35) which faces towards the circuit board (4) and of which three wall-parts (16b, 16c, 16d) define an opening (36) which faces towards the cable connecting part. A circuit-board layer which is at least partially surrounded by the electrical contact means is connected to earth potential. This layer being located closely adjacent the electrical contact means (30). The electrical contact means (30) is comprised of spring contact strips surface mounted on the circuit board and with which the casing edge surfaces coact in a readily fitted and readily released fashion.

24 Claims, 1 Drawing Sheet

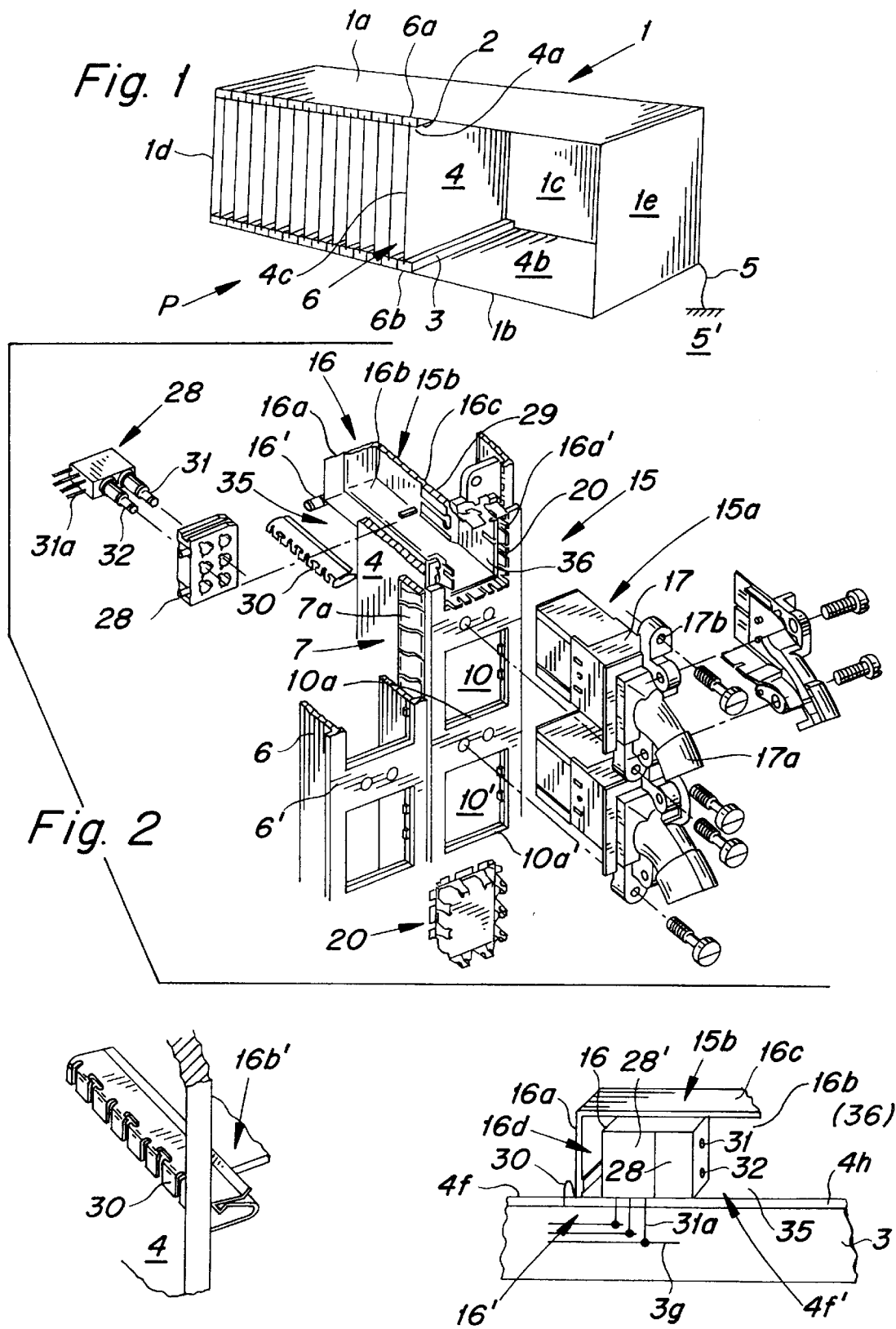

ELECTRICAL CONNECTOR AND A PRINTED CIRCUIT BOARD

TECHNICAL FIELD

The present invention relates to an electrical connector, and more particularly but not exclusively to an electrical connector having an earth-potential related cable connecting part and an earth-potential related circuit-board connecting part.

More particularly, the present invention intends to provide an electrical connector for connecting together electrical conductors which carry digitally-related current and voltage information pulses which because of the high frequency used generate electromagnetic fields that cannot readily be mastered. The selected frequency, or bit rate, may lie in the MHz range, or even higher.

The inventive connector is particularly intended for use with earth-related circuit-board magazines, with which external conductors and/or cables are intended to be brought into coaction with circuit-board related circuits, conductors and the like by means of electrical connecting devices.

Magazines of this kind are adapted to handle, within electronic circuits, information-carrying signals whose current and/or voltage pulses may have a frequency or bit rate within the Gb/s range.

Such electronic systems are encumbered with the drawbacks that high frequency electromagnetic signals "leak" out as radio waves, while the circuit becomes sensitive to such electromagnetic disturbance fields and therewith loses the ability to transmit and process the information-carrying signals correctly.

The invention therefore intends, from certain aspects, to provide a system wherein all disturbing signal routes are effectively screened and related to earth potential.

The invention is also intended to overcome EMC-type disturbance fields (Electro Magnetic Compatibility) and also in certain cases EMD-type disturbance fields (Electro Magnetic Discharges).

DESCRIPTION OF THE BACKGROUND ART

With regard to the technical field with which the present invention is concerned, several types of different electrical connectors are known to the art, these electrical connectors and the electrical contact devices associated therewith, for instance male and female contacts, are normally adapted for a chosen specific application.

With regard to features specific to the present invention and also to the specific technical field of the invention and the object of effective electromagnetic screening and earth potential relationship, it can be mentioned that electrical connectors are known to the art which include a cable connecting part and a circuit-board connecting part, and where the metallic casings of these connecting parts function as an electromagnetic screen and are earth-potential related, and also include means for giving the casings of respective connecting part a common potential, such as a common earth potential when said connecting parts mutually coact.

Such effective screening is necessary because modern electronic systems often utilize signals of very high frequencies and bit rates. It is to be expected that still higher frequencies and bit rates will be used in the future.

Practical tests have also shown that from the screening aspect, the weakest points are the necessary connecting points between external conductors and the circuit boards mounted in a circuit-board magazine. The connections are effected with electrical connectors connected between one or more circuit boards and external cables or conductors.

Examples of the earlier standpoint of techniques are found in prior publications EP-A1 0,370,833, 0,430,105, 0,467, 400, 0,512,438, 0,561,497, 0,524,426, U.S. Pat. No. 4,420, 793 and WOA1 87/07441.

These publications teach the use of hole-mounted screening casings connected with the earthing plane of respective circuit boards.

An electrical connector means of this kind also requires the circuit board to have earth-potential related electrical contact means on the edges thereof, so that electrical and mechanical coaction can be achieved with a circuit board related connecting part of the casing.

SUMMARY OF THE INVENTION

TECHNICAL PROBLEMS

With regard to the known state of the art as described above, it will be seen that a technical problem is one of providing simple two-part electrical connector means which in addition to providing an effective screen will also include a circuit board related part which enables a screened casing to be easily connected with the edge-part of a circuit board or some other part thereof.

Another technical problem resides in producing an electrical connector means having a screened casing of the aforesaid kind from simple components and parts and at acceptable costs.

When considering the known state of the art as described above, it will also be seen that a qualified technical problem is one of providing surface-mounted means and providing readily releasable coaction between said means and a screening casing required to effectively screen electromagnetic disturbance fields that may otherwise occur adjacent the electrical connector means used.

It will also be seen that another technical problem is one of realizing the conditions required and the form of the means necessary for screening disturbance fields through coaction of the screened casing of the circuit-board connection part and a recess or aperture in a rail greater than the casing, and therewith realizing the conditions required to adapt the position of the casing relative to the rail, with regard being paid to tolerances.

Another technical problem is one of realizing the dimensioning requirements that are needed and to adapt the construction of a necessary two-part electrical connector for signal-carrying pulses in the MB/s range and also in the GB/s range.

In this regard, a technical problem resides in providing an electrical connector which has a sufficiently low resistive connection and a sufficiently low capacitive connection between the cable-related part of the connector and the circuit-board related part thereof.

When studying the earlier state of the art, it will also be seen that with regard to an electrical connector means that has a cable connecting part and a circuit-board connecting part, wherein the metallic casings of said connecting parts are electromagnetically screened and earth-potential related or earth-potential connected and include means for providing the casings of respective connecting parts with a common earth potential when said connecting parts are in an active cooperative state, and wherein said circuit board includes edge-orientated, surface-mounted, earth-potential related or earth-potential connected electrical contact means for coaction with the casing of the circuit-board connecting part, it will be seen that a problem resides in the provision of simple means whereby the casing of the electrical connector means will screen effectively electromagnetic disturbances originating from very high frequencies, generated by information-current pulses and voltage pulses having a frequency of at least up to the Gb/s range, and therewith realize the significance of allowing said electrical contact means to extend through 360° around said parts and to afford a good resilient electrical contact function connected to earth potential.

It will also be seen that a technical problem resides in providing conditions which will enable the desired screening effect to be achieved when a cable connecting part has not been connected to a circuit-board connecting part and the connection is consequently still open.

With regard to achieving effective screening and an effective earth-potential connection or an effective earth-potential relationship, it will be seen that a technical problem resides in realizing the advantages that are afforded when a unit provided with an electrical contact device positioned adjacent said electrical contact means and lacking a metallic casing on its or their associated connector means can be joined electrically with a circuit-board contact surface or surfaces through the medium of a connecting wire (or wires) or pin connectors.

It will also be seen that a technical problem resides in realizing the necessity of allowing the metallic casing of the circuit-board connecting part to consist in at least four wall parts which are normally angled and of which three wall parts form electrical contact surfaces which face towards the circuit board and have an opening which surrounds the electrical contact devices, one surface layer of the circuit board which at least partially surrounds the electrical contact means is related to earth potential and that said layer is located in the close vicinity of the electrical contact means.

It will also be seen that a technical problem is one of realizing the advantages that are afforded when the circuit-board contact surface or surfaces is/are structured for coaction with a first category unit provided with an electrical connecting device and/or an electrical contact device, and by positioning the aforesaid casing so as to surround said first category unit when said surface-orientated connecting means coact.

Another technical problem is one of realizing the advantages that are associated with and the measures required to structure the circuit-board electrical contact surface or surfaces for coaction with a second category unit provided with an electrical connecting device and/or electrical contact device, this second unit differing from the first unit, where said first category unit is comprised of coaxial connections and the second category unit is comprised of a different type of connecting lines, such as opto-cables, power-cables, etc.

Another technical problem is one of providing a circuit-board connecting part whose screening metallic casing can be readily applied to and released from circuit-board connecting means, such as rows of electrical contact springs, in a first direction but is fixed in relation to another direction perpendicular to said first direction, this other direction conforming to the direction in which the cable connecting part is inserted into the circuit-board connecting part.

Another technical problem is one of realizing that one or more edge-parts of the casing of the circuit-board connecting part defining said opening and facing towards the circuit board can be given greater mechanical stability and greater strength between the screening casing and the circuit board by providing the casing with guide pins adapted for loose coaction with recesses or holes on the circuit board, and by positioning the guide pins in the corners of the casing and connecting said pins to an earth potential in the absence of solder connections.

It will also be seen that a technical problem is one of realizing that an open circuit-board connecting part can be effectively screened by dimensioning the distance between the opening in the casing of the circuit-board connecting part that accommodates the cable connecting part, and the free parts of the electrical contact devices in said contact device units that face towards said opening, such that this distance and the casing perimeter can be adapted to provide screening of electromagnetic fields generated by thus exposed electrical contact devices or otherwise receivable.

It will also be seen that in order to solve one or more of the aforesaid technical problems, a further technical problem resides in realizing the advantages that are afforded when the mounting base of said unit provided with said electrical contact devices is adapted to occupy a volume equal to or corresponding essentially to one-third of the total volume defined by the casing interior and the surface area of the circuit board.

It will also be seen that another technical problem is one of providing conditions which will enable the volume of the mounting base to be accommodated within a space which faces away from the opening facing towards the cable connecting part.

When considering the present state of the art, it will also be seen that in the case of a circuit board which is provided with a plurality of connecting parts having a plurality of circuit-board related electrical contact surfaces, a problem resides in adapting each of said connecting parts for coaction with a unit provided with electrical contact devices and therewith create conditions in which a first number of electrical contact surfaces are adapted for coaction with a first category unit provided with electrical contact devices, while a second number of electrical contact surfaces are adapted for coaction with a second category unit provided with electrical contact devices.

In addition, it will be seen that a technical problem resides in providing conditions whereby a third number of electrical contact surfaces can be adapted for coaction with a third category unit provided with electrical contact devices, and so on, where one and the same casing of the circuit-board part is adapted to surround a unit of any selected category.

It will also be seen that a technical problem resides in providing simple means and measures which will enable at least a number of units provided with electrical contact devices chosen from a number of available units to be coordinated adjacent one another with a spacing which only insignificantly exceeds the requisite space between the casings of mutually adjacent circuit-board associated units.

With regard to an effective screening effect, it will also be seen that a technical problem resides in realizing the significance of and the advantages afforded by positioning the opening of respective circuit-board connecting parts facing towards the cable connecting part at a predetermined distance beyond an edge-part of the circuit board, and by extending the casing part surrounding the opening towards and beyond the circuit-board rail, such as a front rail, connected to earth potential.

It will also be seen that a technical problem is one of realizing the significance of allowing the front rail to be comprised of an inner front rail, and of creating conditions which will ensure an earth potential connection via means herefor.

Another technical problem is one of realizing the significance of providing the screening casing part with a collar which extends through an opening in the front rail, such as thereby to contribute to said desired screening effect, and within a last, a terminating, connection insertion between the connecting parts provide conditions for satisfactory coaction with said means.

It will also be seen that a technical problem resides in realizing the importance of using a specifically designed resilient or sprung device which encloses an angle of 360° and which is able to provide respective casings and at least one front rail with a common earth potential.

It will also be seen that a technical problem is one of providing means which will enable the metallic casing of at least one connecting part of an electric connector having two connection parts to be electromagnetically screened and/or connected to earth potential, said connecting part being affixed to a circuit board or multilayer board and extended through an aperture in a rail, such as a front rail, associated with said circuit board, while nevertheless enabling a simple construction to be achieved.

It will also be seen that a technical problem in this regard is one of realizing the importance of allowing that part of the connecting part that is inserted into the front rail to have the form of a screened casing or a metallic casing which is fixed in relation to the multilayer pattern board and adapted to cover a readily releasable board connector or electrical contact device and associated mounting base member fixed in relation to the multilayer card, and to allow the board connecting device or electrical contact device to extend through an associated opening in the front rail and arrange the means in the form of a screened spring on the screened casing and position the same between the screened casing and the opening in the front rail, and by permitting the screened casing to be open towards the multilayer board and towards the board front opening and provided with recesses or apertures, wherein the screened spring forms around the screened casing a frame which has a plurality of outwardly pointing spring tongues which are intended to lie in abutment with the front rail, and a plurality of spring tabs which extend along the screened casing, the outer parts of these tabs being provided with inwardly directed tongues, wherein the inwardly directed tongues are accommodated in recesses or apertures in the screened casing and lie against a cable device or cable-related part inserted into the screened casing.

It will also be seen that a technical problem is one of realizing the importance of and the advantages afforded by permitting the inwardly directed tongues to be rounded or bevelled so as to facilitate insertion of the cable connector into the screened casing or the metallic casing.

It will also be seen that a technical problem is one of realizing the importance of and the advantages associated with providing the screened casing with a circumferential flange against which the screening spring frame will abut.

In addition to the above problems, it will be seen that a further technical problem is one of realizing the importance of and the advantages associated with providing the screening spring with bosses or like promontories for abutment with the flange of the screened casing, and also the importance of the positions of said bosses on said spring.

A further technical problem is one of realizing the importance of and the advantages associated with providing the flange of the screened casing with screw-threaded holes to enable a cable connector or a cable part to be secured relative to a front rail.

SOLUTION

With the intention of solving one or more of the aforesaid technical problems, the present invention takes its starting point from an electrical connector means having a cable connection part and a circuit-board connection part, wherein the metallic casings of said connection parts are electromagnetically screening casings and are connected to earth potential and include means for providing the casings of respective connecting parts with a common earth potential when said parts are in a mutually coacting state, and wherein the circuit board includes edge-orientated, resilient electric contact means which are connected to earth potential and which coact with the metallic casing of the circuit-board connecting part.

With a starting point from an electrical connector means of this kind, it is proposed in accordance with the present invention that a unit provided with electrical contact devices and positioned within said electrical contact means shall be connected by its associated connecting device or devices with a circuit-board contact surface or surfaces through the medium of connecting wires or connecting pins, whereas the metallic casing of the circuit-board connecting part is comprised of four wall-parts which are normally, but not necessarily, angled at 90° and of which three wall-parts define an opening which faces towards the circuit board and of which three wall-parts define an opening which faces towards the cable connecting part, and of which one wall-part forms a circuit-board layer which is at least surrounded partially by the electrical contact means and is connected to earth potential, said layer being located closely adjacent said electrical contact means.

In the case of one such circuit-board connecting part, it is proposed that the electrical contact means provided on the edge of the circuit board and connected to earth potential are comprised of surface-mounted contact-spring strips which are so orientated so as to enable them to be easily brought into contact with and removed from the edge-parts of the casing facing towards the circuit board, by moving the casing towards and away from said circuit board respectively.

Other embodiments which fall within the scope of the inventive concept include structuring the circuit-board contact surface or surfaces for coaction with a first category unit provided with an electrical contact device and/or an electrical connector device, and adapting the metallic casing to embrace the unit provided with said electrical contact device in coaction with said electrical connection means, configured in the shape of a "U".

According to one embodiment of the invention, one or more of the edge-parts that define in the metallic casing an opening which faces towards the circuit board is/are provided with guide pins for loose coaction with holes or recesses in the circuit board.

In this regard, the guide pins may advantageously be located in the corners of the metallic casing.

In order to provide adapted screening of an open circuit-board connecting part, it is proposed in accordance with the present invention that the distance between the opening in the casing of the circuit-board connecting part accommodating the cable connecting part and the exposed parts of the electrical contact devices in the unit provided with said devices and facing towards said opening is such as to provide adapted screening of electromagnetic fields generated by or capable of being received by exposed electrical contact devices.

In this regard, it is proposed that one inner surface of the casing of the circuit-board connecting part is provided with one or more guide grooves which are adapted to take a predetermined relationship between the two connecting parts.

It is also proposed that the guide grooves are orientated within a surface area close to the electrical contact device.

It is also proposed in accordance with the invention that a section of the casing of the cable connecting part is able to take a position close to said guide grooves in a coactive position coactive with the casing of the circuit-board connecting part.

According to one embodiment of the invention, the mounting base of the unit provided with said electrical contact devices is adapted to occupy a volume which equals or generally corresponds to a third of the volume defined by the casing interior.

The invention includes the use of a circuit board, a circuit board assembly or a multilayer circuit board (so-called pattern board), and is particularly concerned with multilayer circuit boards whose one flat surface is provided with a plurality of circuit-board connecting parts included in an electric connector means which also includes a cable connecting part or the like having a plurality of electric contact surfaces associated with the edge of the circuit board, each of said electrical contact surfaces being intended for coaction with a unit provided with electrical contact devices, or with a mounting base.

In the case of circuit boards of this nature, the present invention proposes that a first number of electrical contact surfaces are adapted for coaction with a first category unit provided with electrical contact devices, and a second number of electrical contact surfaces are adapted for coaction with a second category unit provided with electrical contact devices, and that a third number of electrical contact surfaces may be adapted for coaction with a third category unit provided with electrical contact devices, and so on, and that each unit is covered by a screening casing that coacts with U-shaped electrical contact spring strips applied to a circuit board.

The present invention enables a plurality of such units to be coordinated in close relationship, by placing at least a number of selected units adjacent one another with a spacing therebetween which only slightly exceeds the space required to accommodate the casings of adjacent units, and their spring contact strips.

It is also proposed that each opening of respective circuit-board connecting parts facing to-wards the cable connecting part extends at a predetermined distance beyond a circuit-board edge-part, and that the casing part which surrounds said opening extends towards and beyond a circuit-board rail, such as a front rail, connected to earth potential.

According to the present invention, the rail connected to earth potential may be an inner rail.

The casing part for the circuit-board related connecting part shall have the form of a collar which extends through an opening provided in the front rail.

ADVANTAGES

Those advantages that are primarily associated with an inventive electrical connector means reside in the provision of means whereby a two-part connector connected to earth potential and establishing an electrical connection with electrical circuit boards having components and features adapted for telecommunications systems to be protected and screened against electromagnetic disturbance fields by meticulous dimensioning and earth-potential relating the metallic casings of the electrical connection parts, among other things by using especially designed resilient circuit-board mounted and earth-potential connected connection means in the form of contact spring strips and a circuit board layer which is connected to earth potential.

The primary characteristic features of an inventive electrical connector means are set forth in the characterizing clause of the following claim 1.

BRIEF DESCRIPTION OF THE DRAWING

A magazine and its associated components and features having characteristics significant of the present invention will now be described in more detail with reference to the accompanying drawing, in which FIG. 1 is a perspective view of a magazine which is connected to or related to earth potential and which accommodates a plurality of circuit boards, shown schematically in the Figure;

FIG. 2 is an exploded view of a circuit board which includes front rails, and an electrical connector means having a cable connection part and a circuit-board connection part, and components related thereto, and shows a contact spring strip in larger scale fitted to a circuit board; and FIG. 3 is a sectional side view of part of a circuit-board connection part fastened to the upper surface of the circuit board.

BEST MODES OF CARRYING OUT THE INVENTION

FIG. 1 is a perspective view of a magazine 1 which accommodates a plurality of assembled printed circuit boards, or multilayer circuit boards (pattern boards), with said boards being shown schematically.

The magazine 1 illustrated in FIG. 1 includes a top plane 1a, a bottom plane 1b and a back plane 1c. The top plane 1a includes an electrical connection arrangement 2, while the bottom plane 1b includes an electrical connection arrangement 3 and one such connection arrangement or a similar connection arrangement may well be mounted on the back plane 1c.

The illustrated exemplifying embodiment is intended to show that the electrical connection arrangements 2 and 3 are earth potential-related or connected to earth potential, and are intended to connect the earth-potential related or earth-potential-allocated outer layer of the multilayer circuit board electrically to the metallic frame of the magazine.

The electrical connection arrangement, 2 or 3, is intended to connect mechanically and electrically with the magazine chassis and, in a known manner, also with a row of one or more electrical contact surfaces distributed along an edge-part (4a and/or 4b), such as a bottom edge part 4b, of each circuit board 4.

The circuit board 4 is, in principle, identical to remaining boards and it is assumed that the board 4 can be pushed gently to the position shown in FIG. 1. The direction of board movement is referenced P.

As will be described in more detail with reference to FIG. 2 and 3, it is important that the magazine 1 related to earth potential and its frame or metal chassis are in electrical contact with an earth potential reference 5', via a conductor 5.

The magazine 1 is adapted to accommodate a predetermined number of assembled printed circuit boards or other board forms in side-by-side relationship.

Each circuit board 4 includes a metallic inner rail 6 (shown only in FIG. 2) which extends along one side 4c of the board and which is related to earth potential via upper 6a and/or lower 6b contact surfaces, through the medium of the magazine casing or frame.

Each such rail, such as the rail 6, is in electrical and mechanical contact with one or more adjacent rails or like devices through the medium of first electrical connector means 7, said like devices including the side planes 1d or 1e of the magazine 1.

At least a predetermined number of rails, such as the rail 6, said number corresponding to or being less than the number of circuit boards 4, may be provided with one or more apertures or openings, wherein one such aperture or opening is referenced 10 and an underlying aperture or opening is referenced 10' in FIG. 2.

The rail 6 is an inner rail and has a U-shaped cross-section, whereas an outer, electrically isolated rail 6' is flat.

Both of the rails 6 and 6' have coordinated apertures or openings.

Each of the apertures or openings is allocated a surface extension with the edge surfaces 10a and the edge surfaces 10a' defining respective apertures 10 and 10', which have a shape adapted to surround and to coact with a circuit-board associated or a circuit-board related connection part 15b of an electrical connector means 15, which is comprised of said circuit-board related connection part 15b and said cable-related connection part 15a.

The edge surfaces 10a defining the aperture 10 (or the edge surfaces 10a' defining an adjacent aperture 10') are intended to surround a first part or front part 16a' of a metallic casing 16 belonging to the circuit-board related connection part 15b.

The rail 6 and/or a front rail 6' is in electrical and mechanical contact with the front part 16a' of the metallic casing 16, through the medium of second electrical connecting means 20.

As shown in FIG. 2, the rail 6 may be covered by a front rail 6', and the front rail 6' may be electrically insulated and is made of a plastic material or some other suitable material.

However, an electrically conductive front rail 6' may be related or connected to earth potential through the medium of upper and/or lower contact surfaces (not shown).

The illustrated first electrical connection means 7 has an elongated shape and includes a row of contact springs which face away from the rail 6 and abut an adjacent rail, one of said springs being referenced 7a in the Figure.

It suffices to say in this regard that the connection means 7 is intended to provide an electrical contact between a rail 6 or 6' and an adjacent circuit-board rail, and also to relate the rail to earth potential.

There will now be described primarily an electrical connector means 15 with reference to FIG. 2. The connector means includes a cable connection part 15a or cable-related connection part, and a circuit-board connection part 15b, or circuit-board related connection part, the metallic casings 16, 17 of said connection parts being electromagnetically screened and connected to earth potential, or related to earth potential, and include the springy second connector means (20) effective to provide the metallic casing 16, 17 of respective connection parts with a common earth potential 5' when the connection parts 15a, 15b are in a mutually coacting state, wherein the circuit board 4 has edge-orientated electrical contact means 30 which are connected or related to earth potential and intended for coaction with edge surfaces on the metallic casing 16 of the circuit-board related connection part 15b.

The illustrated circuit-board related contact means 30 has the form of electrical contact spring strips orientated in a "U"-configuration on the circuit board, with the legs of the strips extending at right angles to the edge of the circuit board or the rail 6', for coaction with the free edge surfaces of the casing 16.

The fragmentary enlarged view illustrates the manner in which a contact spring strip 30 coacts with the free edge surface 16b' of the casing 16, this strip being soldered to solder pads on the circuit board 4, to obtain an earth connection in a known manner.

As will be seen from FIG. 3, the electrical contact means 30 includes a unit 28, 28' provided with electrical contact devices, or a mounting base, arranged in a "U" shape on the circuit board 4. The connecting devices of the unit, or units, are connected to one or more circuit-board pin connectors or surfaces, such as the signal conducting layer 3g with the aid of a connecting wire(s) or connecting pins, such as the pin connector 31a.

The mounting base 28, 28' also carries electrical contact devices 31, 32 included in a sleeve 28 which forms part of the mounting base.

The metallic casing 16 of the circuit-board related connection part 15b is comprised of four wall-parts 16a, 16b, 16c and 16d, this latter wall part being omitted in FIG. 3 although not necessarily so, the walls are normally right-angled. Three wall-parts, namely wall-parts 16a, 16b and 16d, define an opening 35 which faces towards the surface 4f of the circuit board 4, while three wall-parts 16b, 16c and 16d define an opening 36 which faces towards the cable-related connection part 15a.

The electrical contact means 30 at least partially surround the circuit-board layer, which is related to earth potential through the medium of the layer 4h which is contiguous to and connected with said electrical contact means 30.

A circuit-board contact surface 4f' (or surfaces) is structured for coaction with a first category unit 28, 28' provided with contact devices 31, 32, and the casing 16 is adapted to surround the unit 28, 28' with edge-related coaction with the connection means 30.

The contact surface 4f' (or surfaces) of the circuit board may also be structured for coaction with a second category unit provided with contact devices.

The first category unit may be comprised of an electrical connector for coaxial cables, in accordance with the embodiment illustrated in FIG. 2, and the second category unit may be comprised of a different type of electrical connector, such as an octo-conductor, power conductor, etc., of a known kind (not shown).

One or more edge-parts of the casing 16 defining an opening 35 which faces towards the circuit board 4 is/are provided with guide pins 16' for loose coaction with recesses or apertures on the circuit board 4. The guide pin 16' may be coactive with the layer 4h, as shown in FIG. 3.

The guide pins 16' will preferably be four in number and corner mounted, so as to hold the casing 16 firmly to the circuit board 4, assisted by the clamping action afforded by the electrical contact means 30.

Referring to FIG. 2, the distance between the opening 16a' provided in the casing 16 of the circuit-board related connection part intended to receive the cable-related connection part 15b and those parts of the electrical contact devices 31, 32 of the unit 28 that face towards said opening is adapted to provide screening of electromagnetic fields generated by or otherwise received by the thus exposed electrical contact devices 31, 32.

An inner surface 16c of the casing 16 of the circuit-board related connection part facing towards the circuit board 4 includes one or more guide grooves 29 adapted to establish a predetermined relationship between the connection parts 15a, 15b, so that these parts can only be inserted when in definite mutual relationship.

The guide grooves 29 are located within a surface area close to the contact device 31, 32.

The cross-sectional shape of the metallic casing 17 of the cable-related connection part 15a is such that said casing 17 will take a position close to one of said guide grooves 29 when in a coacting position with the casing 16 of the circuit-board related connection part.

A mounting base 28, 28' belonging to the unit provided with contact devices is adapted to occupy a volume which is equal to or essentially corresponds to a third of the volume defined by the interior of the casing 16 and the surface area of the circuit board.

This mounting base volume is located within a space which faces away from the opening 36 facing towards the cable-related connection part.

A circuit board 4 may include a plurality of circuit-board related connection parts 15b having a plurality of edge-related electrical contact surfaces 4f', each adapted for coaction with a cable-related unit 15a provided with electrical contact devices.

A first number of contact surfaces 4f' are adapted for co-action with a first category unit 28, 28' provided with contact devices, and a second number of electrical contact surfaces, adjacent the surfaces 4f', are adapted for coaction with a second category unit provided with electrical contact devices.

A third number of electrical contact surfaces may be adapted for coaction with a third category unit provided with electrical contact devices, and so on.

The number of first category units will preferably be equal to the number of units of other categories.

At least a chosen number of units provided with contact devices associated with a plurality of circuit-board related connection parts are arranged close together at a spacing which exceeds the space necessary to accommodate the casings of adjacent units, such as the casing 16 and an adjacent casing in the aperture 10 and the necessary contact spring strips 30.

Each of the parts 16a' of the circuit-board connection part defining the opening 36 which faces towards the cable-related connection part 15a is located at a predetermined distance beyond a circuit-board edge part, and the casing part 16a' defining said opening extends towards and beyond a circuit-board, earth-potential related rail 6 and 6'.

The casing part 16a' has the form of a collar which extends through an opening in the rail 6 and the front rail 6'.

The present invention also relates to a second electrical connection means or an electrical connection arrangement 20 for creating in an electrical connector assembly that has two connection parts such as to create in at least one of said parts an electromagnetic screen and/or an earth-potential relationship, wherein one connection part is attached to a circuit board or a multilayer board and extends through an aperture 10 in a front rail 6 belonging to the circuit board.

The connector means 20 is adapted to coact with an electrical connector assembly having two connection parts so as to create an electromagnetic screen and/or an earth potential relationship in at least one of said connection parts, wherein a connection part in the form of the casing 16 is attached to a multilayer circuit board 4 and extends through an aperture in a front rail belonging to the circuit board.

That portion of the connection part which extends through the front rail has the form of a screened casing which is fixed in relation to the multilayer circuit board and covers a board connecting device or unit 28, 28' fixedly related to the multilayer board and extending through an associated opening in the front rail 6, wherein a screening spring connector 20 coacting with the screened casing 16 is located between the casing and the opening in the front rail 6.

The screened casing is open toward the multilayer circuit board and towards the board front opening and is provided with an aperture, and the screened spring connector forms around the screened casing a frame which comprises a plurality of outwardly directed spring tongues that are intended to abut the front rail, and a plurality of spring tabs which extend along the screened casing and the outer extremities of which have appended thereon inwardly directed tongues, wherein the inwardly directed tongues are located in apertures in the screened casing and are intended to lie against a cable connecting device 15a inserted into the screened casing.

The inwardly directed tongues are rounded or bevelled, to facilitate insertion of the cable connecting device or cable connecting means into the screened casing.

The screened casing also includes a circumferentially extending flange, against which the spring connector frame abuts.

The screened spring connector also includes one or more bosses or like promontories intended for abutment with the flange of the screened casing.

The flange of the screened casing is also provided with screw-threaded holes for attachment of a cable connection relative to the front rail.

The two casings of the connector means will conceivably be connected to one another and, across the connector means or the screened spring connector 20, connected directly to the inner front plate or front rail (earth reference), and that the screened spring connector 20 extends through 360° around the casing.

The screened spring connector 20 shall also be capable of compensating for tolerance errors and movements caused by moving the connecting parts into and out of coaction with one another.

It is also important that the connecting parts have a low capacitive connection. This is achieved by dimensioning the metal parts with small tolerances and small gaps and requisite spacing and overlapping of the metallic casings. The coaction between the connection parts 15a, 15b shall also be given a labyrinth radiation trap configuration.

The cable-related part includes an outer cable load-relieving part 17a, which prevents the cable extending from the cable connector means and the electrical contact body within the cable connector means from being disturbed positionally or from individual conductors in the cable being subjected to load. The attachment lugs 17b by means of which the part 15a is attached to the part 15b are configured so that no direct holding contact with the rail 6 or 6' will occur, therewith reducing the tolerance requirements on the dimensions of the front rail 6, 6'. It will be understood that the invention is not restricted to the aforedescribed and illustrated exemplifying embodiment thereof, and that modifications can be made within the scope of the inventive concept as illustrated in the following claims.

We claim:

1. An electrical connector comprising:
   a cable connection part and a circuit-board connection part, wherein first and second casings of said connection parts are electromagnetically screening and earth potential connected and include means for providing the casings of respective connecting parts with a common earth potential when said parts are in a mutually coacting state, wherein the circuit board includes edge-orientated, and resilient electrical contact means connected to earth potential and coacting with the metallic casing of the circuit-board connecting part, wherein a unit provided with electrical contact devices and positioned within said electrical contact means is connected by its associated connecting device or devices with a circuit-board contact surface via connecting elements, whereas the first casing of the circuit-board connecting part is comprised of four wall-parts, of which three wall-parts define a first opening which faces towards the circuit board and of which three wall-parts define a second opening which faces towards the cable connecting part, and wherein a circuit-board layer, which is at least partially surrounded by the electrical contact means, is connected to earth potential, said circuit-board layer being located closely adjacent said electrical contact means, wherein the edge-orientated and earth-potential connected electrical contact means belonging to the circuit board are comprised by surface-mounted contact-spring strips which are adapted for removable engagement with edge-parts of the first casing facing towards the circuit board, and wherein said contact-spring strips have a U-shaped cross-section, a central portion formed as contact fingers and legs biased against opposite sides of said edge-parts of said first casing.

2. A connector according to claim 1, wherein the circuit-board electrical contact surface is structured for coaction with a first category unit provided with electrical contact devices; and in that said casing is adapted to surround said first category unit in a "U"-shaped configuration when coacting with said connection means.

3. A connector means according to claim 1, wherein said edge-parts of the first casing that define an opening which faces towards the circuit board are provided with guide pins for loose coaction with apertures provided in the circuit board.

4. A connector according to claim 3, wherein the guide pins are corner-related.

5. A connector according to claim 1, wherein the second opening provided in the first casing of the circuit-board connection part and those parts of the electrical contact devices facing towards said second opening are spaced at a distance which affords adapted screening of electromagnetic fields generated by or received by exposed electrical contact devices.

6. A connector according to claim 1, wherein an inner surface of the first casing of the circuit-board connection part is provided with one or more guide grooves which are adapted to establish a predetermined relationship between the connection parts.

7. A connector according to claim 6, wherein said guide grooves are located within a surface area proximate the electrical contact device.

8. A connector according to claim 1, the second casing of the cable connection part is positioned proximate one of said guide grooves coacts with the first casing of the circuit-board connection part.

9. A connector according to claim 1, wherein a mounting base associated with the unit provided with said electrical contact devices is adapted to occupy a volume which is approximately a third of the volume defined by the casing interior.

10. A connector according to claim 9, wherein said mounting-base related volume is located within a space which faces away from an opening that faces towards the cable-related connection part.

11. A connector according to claim 1, wherein the connection means extends around the outer opening of the circuit-board associated part through an angle of 360°.

12. A connector according to claim 11, wherein said connection means is resilient and active against the second casing, the second casing and the rail being connected to earth potential.

13. A connector according to claim 11, wherein coaction through the medium of said connection means is activatable to a position in which the parts coact almost completely.

14. A connector according to claim 13, wherein said coaction is activated through the medium of an edge which extends through 360° around the cable connection part.

15. A connector according to claim 11, wherein the second casing can be inserted through a given distance into the first casing.

16. A printed circuit board which includes a plurality of circuit-board connection parts of a kind according to claim 1, having on the edges of the circuit board a plurality of electrical contact surfaces for adapted coaction with a unit provided with electrical contact devices, wherein a first number of electrical contact surfaces are adapted for coaction with a first category unit provided with contact devices, and a second number of electrical contact surfaces are adapted for coaction with a second category unit provided with electrical contact devices, and in that each unit is covered by a screening casing which coacts with U-shaped spring contact strips mounted on the circuit board.

17. A circuit board according to claim 16, wherein a third number of electrical contact surfaces are adapted for coaction with a third category unit provided with electrical contact devices.

18. A circuit board according to claim 16, wherein at least a predetermined number of units provided with said electrical contact devices are arranged adjacent one another with a spacing therebetween which exceeds a space required to accommodate the casings of adjacent units and their associated spring contact strips.

19. A circuit board according to claim 16, wherein each of the circuit-board connection parts facing towards the second opening which receives the cable-related connection part is located at a predetermined distance beyond the edge-part of the circuit board, and in that the opening surrounding the casing part extends towards and beyond a front rail associated with the circuit board, said front rail being connected to earth potential.

20. A circuit board according to claim 19, wherein the front rail is an inner front rail.

21. A circuit board according to claim 20, further comprising means for providing respective casings and front rails with a common earth potential.

22. A connector according to claim 6, wherein the second casing of the cable connection part is positioned close to one of said guide grooves in a position in which it coacts with the first casing (16) of the circuit-board connection part.

23. A connector according to claim 7, wherein the second casing of the cable connection part is positioned close to one of said guide grooves in a position in which it coacts with the first casing of the circuit-board connection part.

24. A connector according to claim 12, wherein coaction through the medium of said connection means is activatable to a position in which the parts coact almost completely.

* * * * *